United States Patent
Ballan

(10) Patent No.: US 6,677,812 B2
(45) Date of Patent: Jan. 13, 2004

(54) METHOD AND APPARATUS FOR REMOVING NOISE SPIKES

(75) Inventor: Oscar Ballan, Monza (IT)

(73) Assignee: STMicroelectronics GmbH, Grasbrunn (DE)

(*) Notice: Subject to any disclaimer, the term of this patent is extended or adjusted under 35 U.S.C. 154(b) by 0 days.

(21) Appl. No.: 10/187,399

(22) Filed: Jun. 28, 2002

(65) Prior Publication Data

US 2003/0062885 A1 Apr. 3, 2003

(30) Foreign Application Priority Data

Jun. 28, 2001 (EP) .......................................... 01115851

(51) Int. Cl.[7] .................................................. H03K 5/00
(52) U.S. Cl. ........................................ 327/551; 327/552
(58) Field of Search ................................. 327/552, 551, 327/34; 375/351

(56) References Cited

U.S. PATENT DOCUMENTS 4,327,446 A      4/1982  Dressler ..................... 455/223
4,464,049 A  *  8/1984  Schroeder ................... 327/552
4,528,678 A      7/1985  Udren ........................ 375/104
5,757,937 A  *  5/1998  Itoh et al. ................. 381/94.3
6,420,873 B1 *  7/2002  Guthrie ...................... 324/322

FOREIGN PATENT DOCUMENTS

EP           0 377 965 A2    7/1990

* cited by examiner

*Primary Examiner*—Dinh T. Le
(74) *Attorney, Agent, or Firm*—Lisa K. Jorgenson; Robert Iannucci; Seed IP Law Group PLLC

(57) ABSTRACT

The invention provides a method for removing noise spikes from an electrical input signal having an AC component, comprising the steps of determining the actual rms value of the input signal, low pass filtering the input signal, producing a variable offset, said variable offset being a function of the actual rms value, forming a variable threshold by superimposing the variable offset to the low pass filtered signal, comparing the input signal to the variable threshold, creating a spike detection signal when the input signal passes the variable threshold, and blanking the input signal during the occurrence of the spike detection signal.

28 Claims, 10 Drawing Sheets

Time of set 0

METHOD AND APPARATUS FOR REMOVING NOISE SPIKES

BACKGROUND OF THE INVENTION

1. Field of the Invention

The invention refers to a method and an apparatus for removing noise spikes from an electrical signal having an AC component.

2. Description of the Related Art

Electrical signals can comprise noise spikes causing disturbance during processing or use of the electrical signal. One example are noise spikes introduced by car engine's electronic interference to radio amplitude modulated (AM) signals. Such noise spikes disturb the output signal of loudspeakers cooperating with an AM car radio.

In many applications it is desired to remove noise spikes.

U.S. Pat. No. 4,965,800 discloses a digital signal fault detector using a low voltage threshold and a high voltage threshold for discriminating binary low states and binary high states, respectively, and comprising a spike detector for detecting signal faults caused by spikes. It is assumed that typical non-spike pulses have a pulse time which is longer than a spike time. The spike detector comprises a low voltage threshold and a high voltage threshold for identifying the state of the input signal as low or high, a means for measuring the continuous duration in the low or the high state and for comparing it with the predetermined spike time, and a means for communicating the occurrence of a spike when the continuous duration of the signal in the low state or the high state is less than the spike time. The spike detector disclosed in U.S. Pat. No. 4,965,800 is not able to react on changes as regards the strength of the input signal. As a consequence, a weak input signal might be discriminated incorrectly and spikes might not be detected.

Such problems might be less serious in case of processing digital input signals which are to be discriminated as to having the low or the high state, only. The problem is, however, much more serious in case of amplitude modulated analog signals, e.g., AM radio signals.

SUMMARY OF THE INVENTION

Embodiments of the present invention aim at removing noise spikes from signals having variable strength, in particular from amplitude modulated analog signals.

Under a first aspect, the invention provides a method for determining the actual rms value of the input signal, low pass filtering the input signal, producing a variable offset, said variable offset being a function of the actual rms value, forming a variable threshold by superimposing the variable offset to the low pass filtered signal, comparing the input signal to the variable threshold, creating a spike detection signal when the input signal passes the variable threshold, and blanking the input signal during the occurrence of the spike detection signal.

By using a variable offset which is dependent on the actual rms value of the input signal and by forming a variable threshold obtained by superimposing the variable offset to a low pass filtered version of the input signal, the threshold and, in turn, the spike detection performance is adapted to a varying strength of the input signal. The threshold approximately follows the amplitude of the input signal with a certain distance therefrom, that does not follow spikes introduced to the input signal because of superimposing the variable offset not to the input signal itself but to the low pass filtered input signal. As a result, different from using a non-variable threshold, spikes can be safely detected irrespective of whether the actual strength of the input signal is high or low.

The removal of a detected noise spike is obtained by blanking the input signal during the occurrence of the spike detection signal.

Under a second aspect, the invention provides an apparatus for removing noise spikes from an electrical input signal having an AC component, comprising means designed for determining the actual rms value of the input signal, a low pass filter low pass filtering the input signal, an offset generator designed for producing a variable offset as a function of the actual rms value, superimposition means designed for forming a variable threshold by superimposing the variable offset to the low pass filtered signal, comparator means adapted for comparing the input signal to the variable threshold and for creating a spike detection signal when the input signal passes the variable threshold, and blanking means designed for blanking the input signal during the occurrence of the spike detection signal.

In an embodiment of the invention, the blanking time is made dependant on the actual rms, i.e. the actual strength of the input signal. Assuming that a spike has a shape which is independent from the shape and the strength of the input signal, the time period during which a detected spike is above (in case of positively directed spikes) or below (in case of negatively directed spikes) the input signal is larger for a weak input signal and is smaller for a strong input signal. This effect can be taken into consideration by making the blanking time dependant on the actual strength of the input signal.

In an embodiment of the invention, the blanked part of the input signal is replaced with an interpolated replacement signal, wherein the interpolated signal is obtained by taking the last input signal value before the blanking time and the first input signal value after the blanking time and by forming a ramp connecting these two input signal values.

If positive spikes are to be expected only, merely a high variable threshold is formed by adding to the input signal a positive variable offset and creating the spike detection signal when the input signal is above the variable high threshold. If negative spikes are to be expected only, merely a low variable threshold is formed by subtracting from the input signal a negative variable offset and creating the spike detection signal when the input signal is below the variable low threshold. If positive and negative spikes are to be expected, a high variable threshold as well as a low variable threshold are formed and the spike detection signal is created when the input signal is above the high variable threshold or below the low variable threshold.

BRIEF DESCRIPTION OF THE SEVERAL VIEWS OF THE DRAWING(S)

Advantages and features of the present invention will become more fully apparent from the following description of embodiments in conjunction with the accompanying drawings.

DETAILED DESCRIPTION OF THE INVENTION

Figure 12:
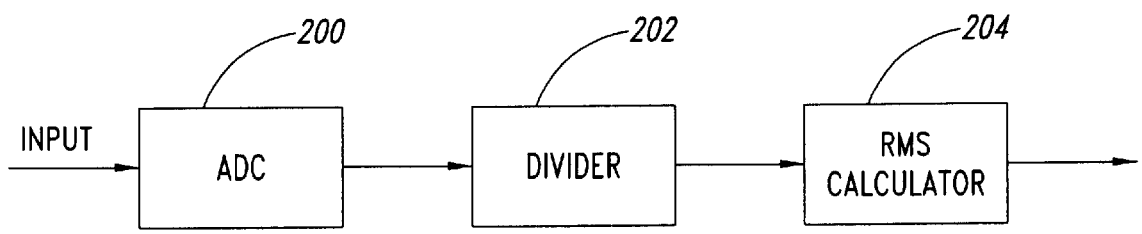
FIG. 12 is a block diagram of an embodiment of the invention employing a digital divider.

In an embodiment of the invention shown in FIG. 12, the input signal is digitized by an analog/digital converter 200 into a sequence of pulses which is divided by a divider 202 into blocks each having a predetermined number of pulses, e.g., 128 pulses. In this embodiment, the actual rms of each block is calculated by an RMS calculator 204 by means of the following formula:

$$\text{rms} = \sqrt{\frac{\sum_{i=1}^{n} x_i^2}{n}} \quad (1)$$

As it is difficult and time consuming for usual microprocessors to calculate square roots, processing according to the following formula is carried out:

$$\text{rms} \sim \frac{\sum_{i=1}^{n} x_i^2}{n} \quad (2)$$

In an embodiment of the invention, the sequence of pulses is transmitted through a digital delay line having taps for tapping pulses traveling through the delay line. Upon occurrence of a spike detection signal, the pulses occurring before the beginning and after the end of the blanking time are tapped from the delay line and the blanked part of the input signal pulses is replaced with pulses obtained by means of an interpolation between the pulses occurring before the beginning and after the end of the blanking time.

The present invention can be used for removing spikes from a demodulated signal obtained by amplitude demodulating an amplitude modulated signal, in particular for removing spikes from an AM audio signal, e.g. of an AM radio signal, where spikes are introduced by the electronic of a car engine, for example. In an embodiment of the invention for removing noise spikes from a radio AM signal, the AM-IF signal (intermediate frequency signal of the AM radio signal) is supplied to a spike detector path and the demodulated AM audio signal is supplied to a spike cancellation path of the invention. In the spike detection path, an envelope signal is generated from the envelope of the amplitude modulated signal, the actual rms value and a local peak value of the envelope signal are calculated, the envelope signal is low pass filtered, the variable offset is produced as a function of the actual rms value and the local peak value, a variable threshold is formed by superimposing the variable offset to the low pass filtered envelope signal, the envelope signal is compared to the variable threshold, and a spike detection signal is created when the envelope signal passes the variable threshold. In the spike cancellation path, the demodulated signal is blanked during the occurrence of a spike detection signal and the blanked part of the demodulated signal is replaced with an interpolated signal.

Because the variable offset is a function of the actual rms value and the actual peak value of the envelope signal, and because the variable threshold is formed by superimposing the suchlike obtained variable offset to the low pass filtered envelope signal, the threshold is made dependent on the signal strength and the signal amplitude, on the one hand, and follows the envelope of the amplitude modulated signal with a certain distance without following peaks, on the other hand.

In an embodiment of the invention, the blanking time is made dependent on the local peak value. This takes into consideration that the peak value of a spike is independent from the peak value of the modulated signal so that the time the envelope signal is masked by a spike is larger for low peak values of the envelope, and is smaller for high peak values of the envelope.

There are further applications for the invention besides the above-mentioned removal of the spikes from an AM radio signal:

Scratches or dust particles on long play vinyl discs cause spikes in the electrical audio signal obtained from the pick-up of a long play disc player, to be heard as clicks. Such spikes can be removed by means of the present invention.

Sensors for controlling hard disc drives generate output signals which can be disturbed by noise such as spikes. Such spikes can also be removed by use of the present invention because the normal spike frequency range is different from the frequency range of the sensor head signal.

Figure 1:
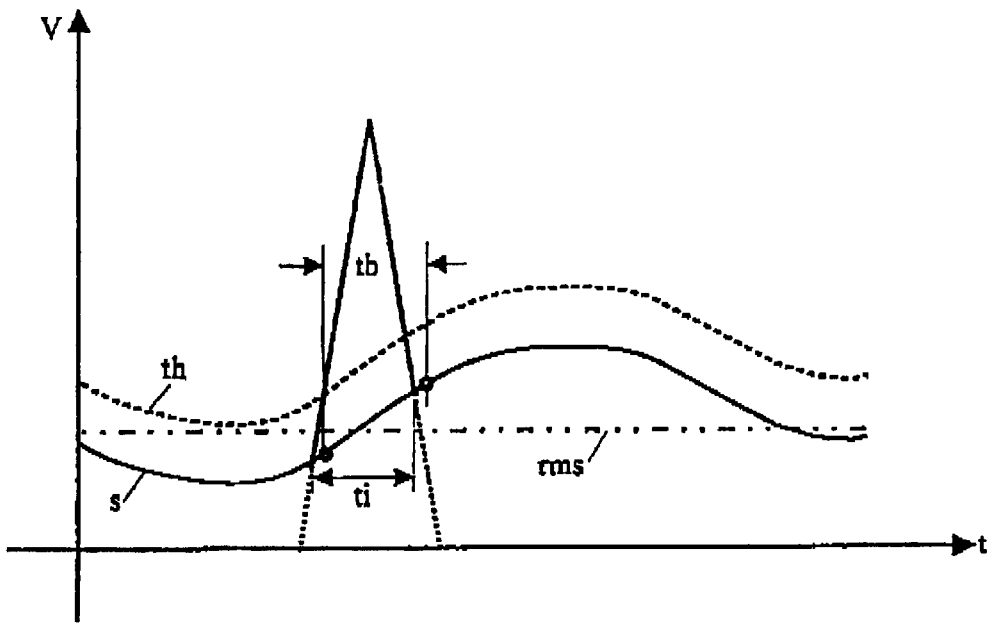
FIG. 1 shows a weak input signal with an interfering spike.
Figure 2:
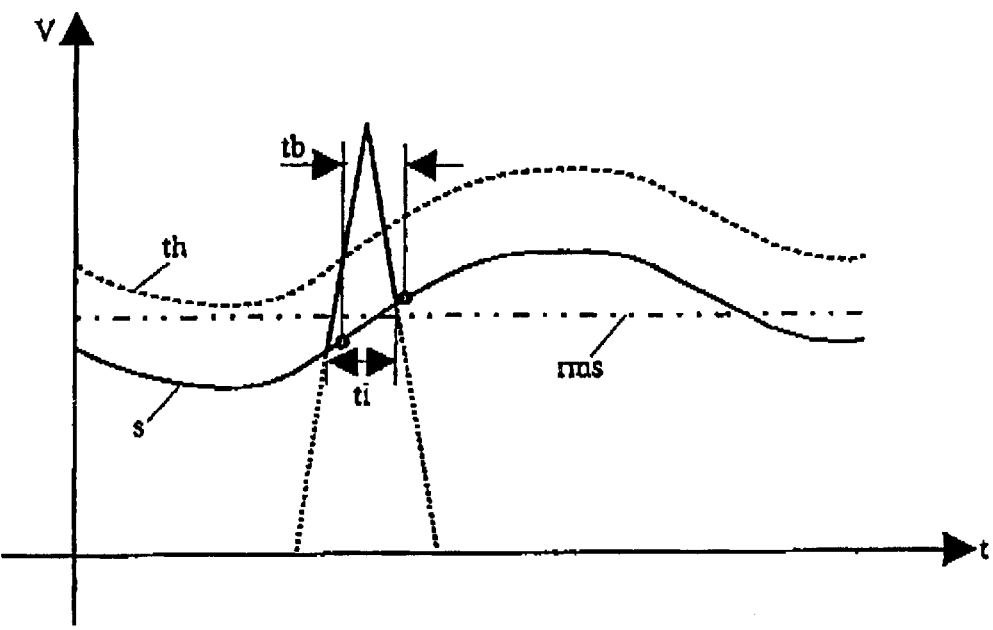
FIG. 2 shows a strong input signal with the same interfering spike.

FIGS. 1 and 2 shows an electrical signal s having an AC component and being disturbed by an interfering spike, the electrical signal s being weak in FIG. 1 and strong in FIG. 2. The time period ti during which the spike exceeds the electrical signal s is larger for the weak signal in FIG. 1 and smaller for the strong signal in FIG. 2.

Figure 3:
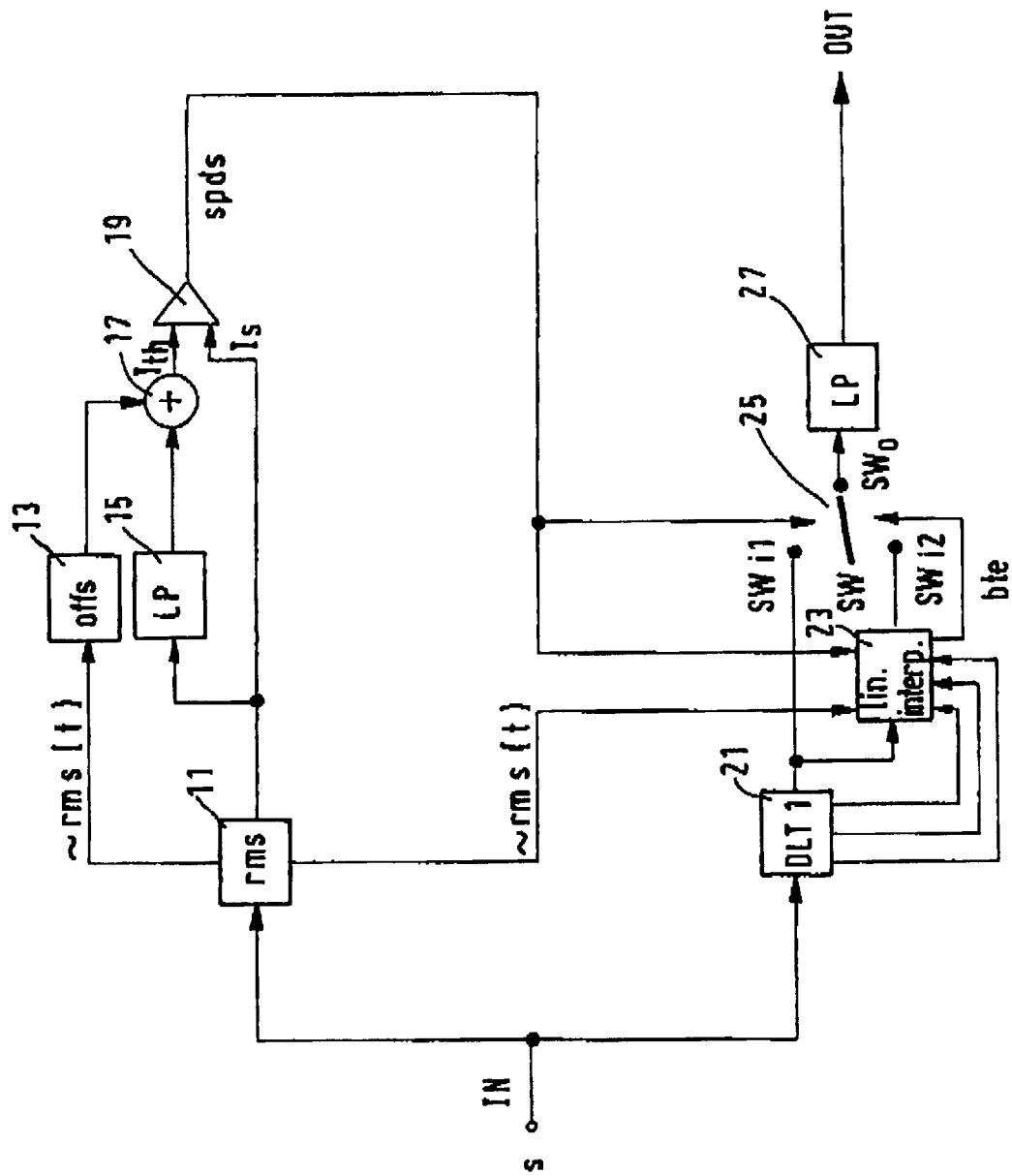
FIG. 3 shows a first embodiment of a spike detection and spike cancellation circuitry of the present invention.

FIG. 3 shows a first embodiment of the present invention comprising a spike detection path (upper path) and a spike cancellation path (lower path).

An input IN common to the spike detection path and the spike cancellation path receives the electrical signal s.

The spike detection path comprises an rms calculator 11, an offset generator 13, a low pass filter 15, a summing circuit 17 and a comparator 19. The comparator 19 comprises a signal input Is and a threshold input Ith. The rms calculator 11 passes the input signal s to an input of low pass filter 15 and to the signal input Is of the comparator 19. The rms calculator 11 calculates from the electrical signal s a actual rms value which is supplied to an input of the offset generator 13 generating a variable offset which is dependent on the actual rms value. The low pass filter 15 has such a filter characteristic that the AC component of the electrical signal s is substantially not changed whereas spikes are substantially suppressed. The low pass filtered signal from low pass filter 15 and the variable offset from offset generator 13 are supplied to summing circuit 17 where the low pass filtered signal and the variable offset are accumulated to a variable threshold supplied to the threshold input Ith of the comparator 19. Comparator 19 compares the unchanged signal s to the variable threshold and outputs a spike detection signal when the electrical signal s is above the variable threshold.

The spike cancellation path comprises a delay line 21, a linear interpolator 23, a switch 25, and a low pass filter 27. The delay line 21 receives the electrical signal s and passes the signal s to a first input SWi1 of the switch 25. An output SWo of the switch 25 is connected to an input of the low pass filter 27, the output of which forms the output OUT of the cancellation path.

The delay line 21 has tabs (three in the embodiment shown in FIG. 3) for supplying to the interpolator 23 amplitude values of the signal s occurring at different times. The linear interpolator 23 further receives the actual rms value from the rms calculator 11 and the spike detection signal spds from the comparator 19. An output of the linear interpolator 23 is connected to a second input SWi2 of the switch 25. The switching states of switch 25 are controlled by the spike detection signal spds from the output of the comparator 19 and by an output signal bte from the interpolator 23, signaling the end of the blanking time.

The embodiment of FIG. 3 is designed for detection and cancellation of positive spikes only. It can easily be modified for detection and cancellation of negative spikes or for detection and cancellation of positive as well as negative spikes. If to be modified for the detection and cancellation of negative spikes, the only change to be made with respect to FIG. 3 is that the offset from offset generator 13 is not added to but subtracted from the low pass filtered signal from low pass filter 15 and that the signal input Is and the threshold Ith of the comparator 19 are changed.

If the embodiment of FIG. 3 is to be modified for detection and cancellation of positive and negative spikes, a second offset generator 13, a second low pass filter 15, a second summing circuit 17, a second comparator 19 and an OR gate would have to be added, as shown and explained below in context with the embodiment shown in FIG. 5.

The operation of the embodiment of FIG. 3 is now explained with reference to FIGS. 1 and 2. For simplification, it is assumed that the electrical signal s after being low pass filtered by means of low pass filter 15 has the same form which the electrical signal s would have if there were no spikes.

The rms calculator 11 calculates actual rms values of rms (t) from the signal course of the electrical signal s during actual time periods of a predetermined time duration. The offset generator 13 generates high offset values for high actual rms values and generates low offset values for low rms values. For that reason, the distance of the variable threshold th from the electrical signal s is shown to be smaller in FIG. 1 and is shown to be larger in FIG. 2.

When no spike is detected, the switch 25 is in the state in which its output SWo is connected to its input Swi1 so that the electrical signal, after passing the delay line 21, is supplied via the switch 25 to the low pass filter 27 and then to the output OUT.

When the input signal s comprising the spike goes above the variable threshold th and the comparator 19 outputs a spike detection signal spds, the switch 25 is switched into the state in which SWo is connected to SWi2 so that the output signal of the linear interpolator 23 is supplied to the low pass filter 27 and then to the output OUT.

The linear interpolator 23 has several functions. First, the interpolator 23 generates a blanking time tb as a function of the actual rms value received from the rms calculator 11. The blanking time tb generated by the interpolator 23 is larger for a weak electrical signal s, i.e., for smaller current actual rms, and is smaller for a strong electrical signal s, i.e., for higher actual rms values because the time during which the spike exceeds the signal s is the larger the weaker the signal s is. Second, the interpolator 23 controls the switch 25 to fall back to the state in which SWo is connected to SWi1, at the end of the blanking time tb. Third, the interpolator 23 selects from the delay line 21 the actual amplitude value of the signal s related to the point of time just before the beginning of the blanking time tb, and the actual amplitude value of the signal s related to the point of time just after the end of the blanking time tb. On the basis of these two selected amplitude values, the interpolator 23 generates an interpolated section of the signal and replaces the detected spike with the interpolation signal section resulting in a cancellation of the spike from the electrical signal s.

Use of the invention for cancellation of noise spikes from AM radio signals is now explained with reference to FIGS. 4 to 11.

Figure 4:
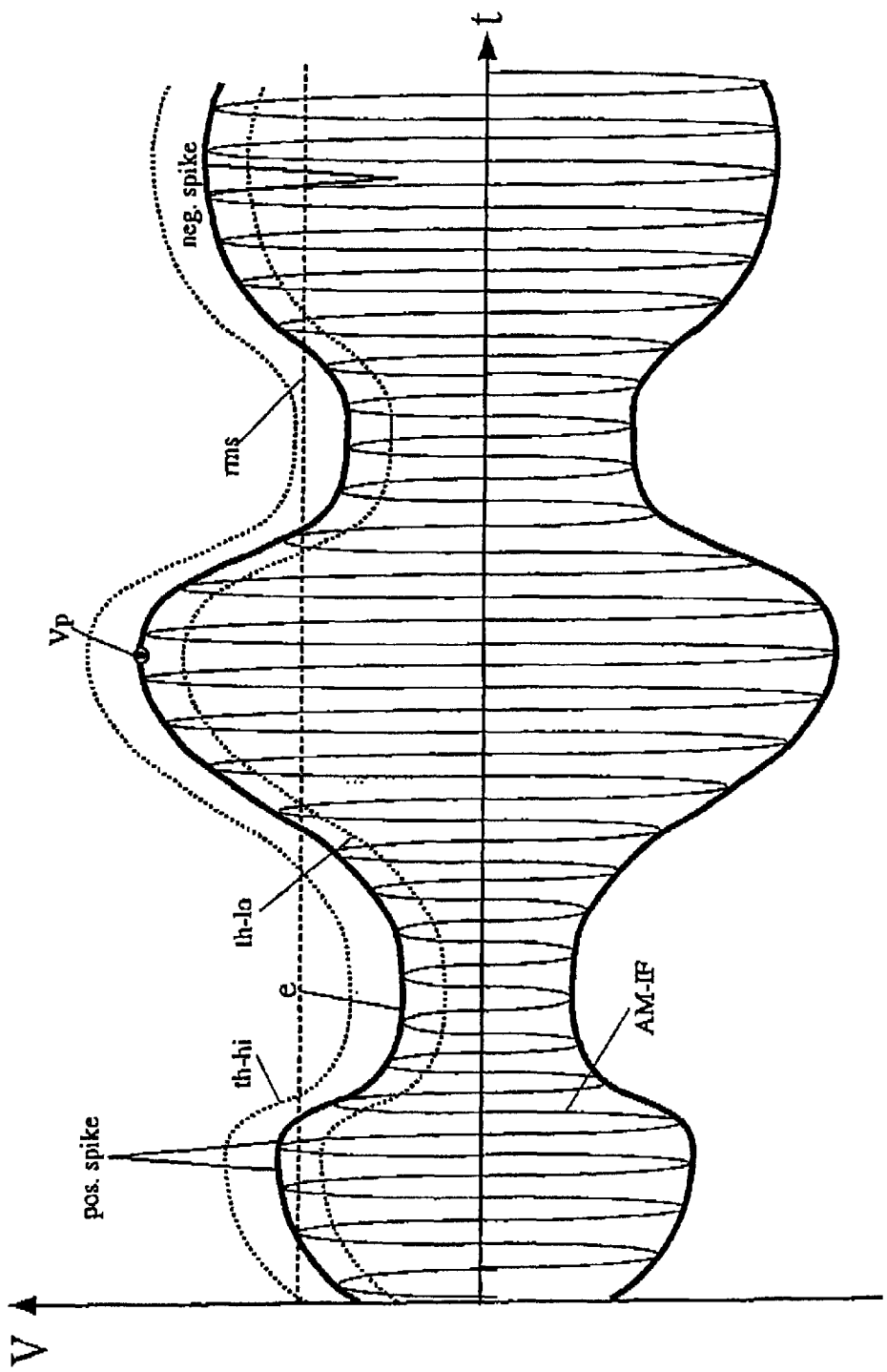
FIG. 4 shows an amplitude modulated signal and its envelope, high and low variable thresholds, a positive spike, and a negative spike.

FIG. 4 depicts an IF (intermediate frequency) of an AM radio signal, an envelope e of the IF AM signal, a low threshold th-lo, a high threshold th-hi, an rms value, a positive spike, and a negative spike. For simplification, it is assumed in FIG. 4 that rms does not change during the time shown in FIG. 4 and that, therefore, the distances of th-lo and th-hi from e are constant during the time shown in FIG. 4.

Figure 5:
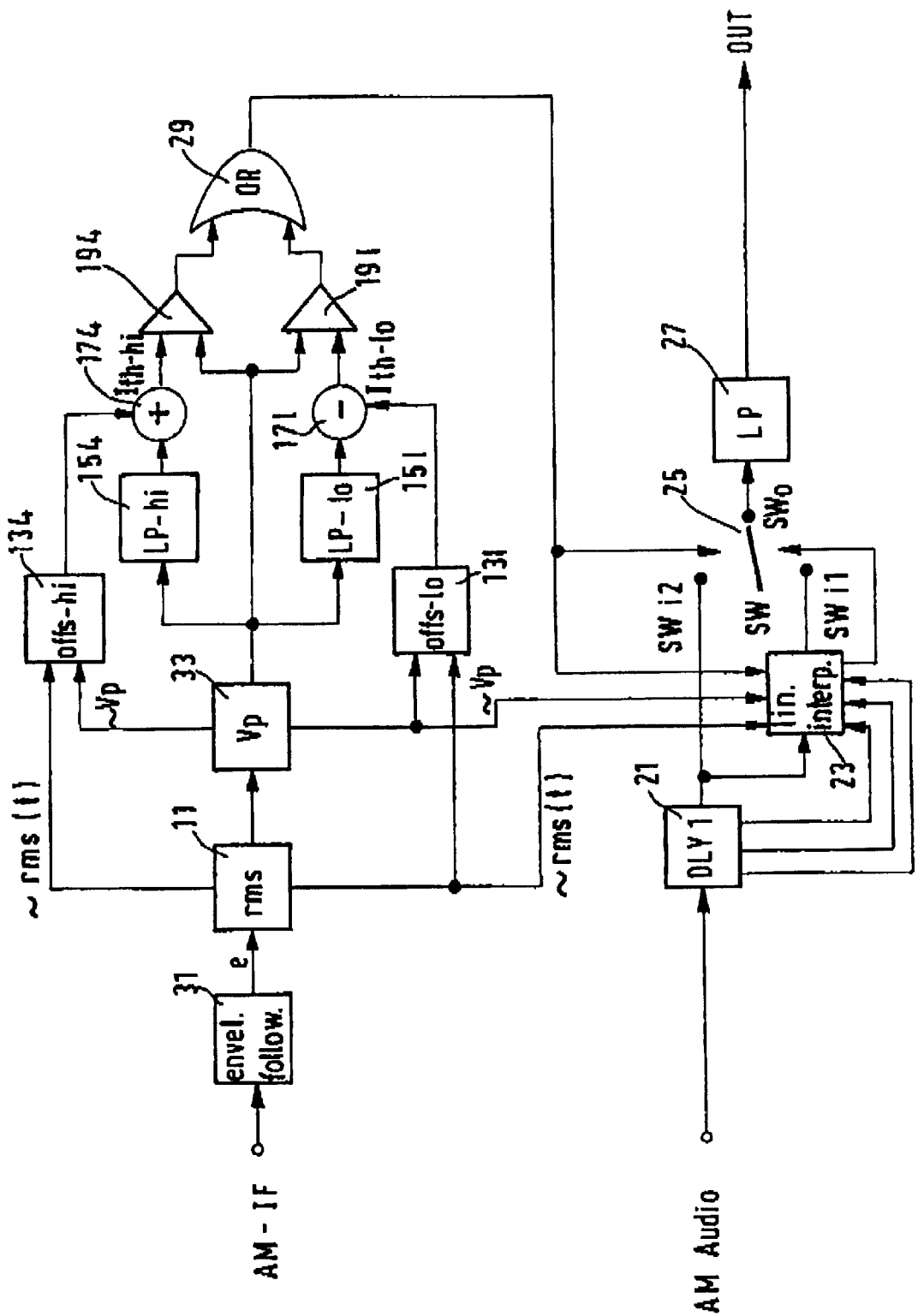
FIG. 5 shows a second embodiment of a spike detection and spike cancellation circuitry of the present invention.

An embodiment of the invention for spike detection and spike cancellation in connection with an AM radio signal is shown in FIG. 5. It is assumed that positive spikes as well as negative spikes can occur so that a positive variable threshold as well as a negative variable threshold are generated, as shown in FIG. 4.

In the embodiment of FIG. 5, the spike detection path receives the AM-IF signal whereas the spike cancellation path receives the demodulated AM audio signal. The AM-IF signal is supplied to an envelope follower 31 which produces an envelope signal e of the positive envelope of AM-IF.

Elements in FIG. 5 having the same function as elements in FIG. 3 have the same reference numerals as in FIG. 3. The spike detection path of FIG. 5 has elements related to the detection of positive spikes, the reference signs of which comprise a letter h (like high), and elements related to the detection of negative spikes, the reference signs of which comprise a letter l (like low). For instance, the offset generators for generating a variable high offset and for generating a variable low offset have the reference signs $13h$ and $13l$, respectively. The spike cancellation path of FIG. 5 is identical to that of FIG. 3.

Summing circuit $17h$ of FIG. 5 adds the variable offset from offset generator $13h$ to the low pass filtered signal from low pass filter $15h$, as in FIG. 3, whereas summing circuit $17l$ subtracts the low variable offset from offset generator $13l$ from the low pass filtered signal from low pass filter $15l$. The circuitry in FIG. 5 comprises an OR gate 29 performing an OR function with respect to the outputs of both comparators $19h$ and $19l$.

The envelope following signal e is passed through the rms calculator 11 and through a Vp calculator 33 before it is supplied to the low pass filters $15h$ and $15l$ and to the signal inputs Ish and Isl of the comparators $19h$ and $19l$, respectively.

The Vp calculator 33 calculates the local peak value Vp of the envelope following signal e and supplies the actual Vp value to second inputs of the offset generators 13h and 13l and to a further input of the linear interpolator 23. Thus, the variable high offset and the variable low offset and, as a consequence, the high threshold and the low threshold, and further the blanking time generated by the interpolator 23, are made dependent not only on the actual rms value but also on the actual Vp value of the envelope following signal e.

Figure 6:
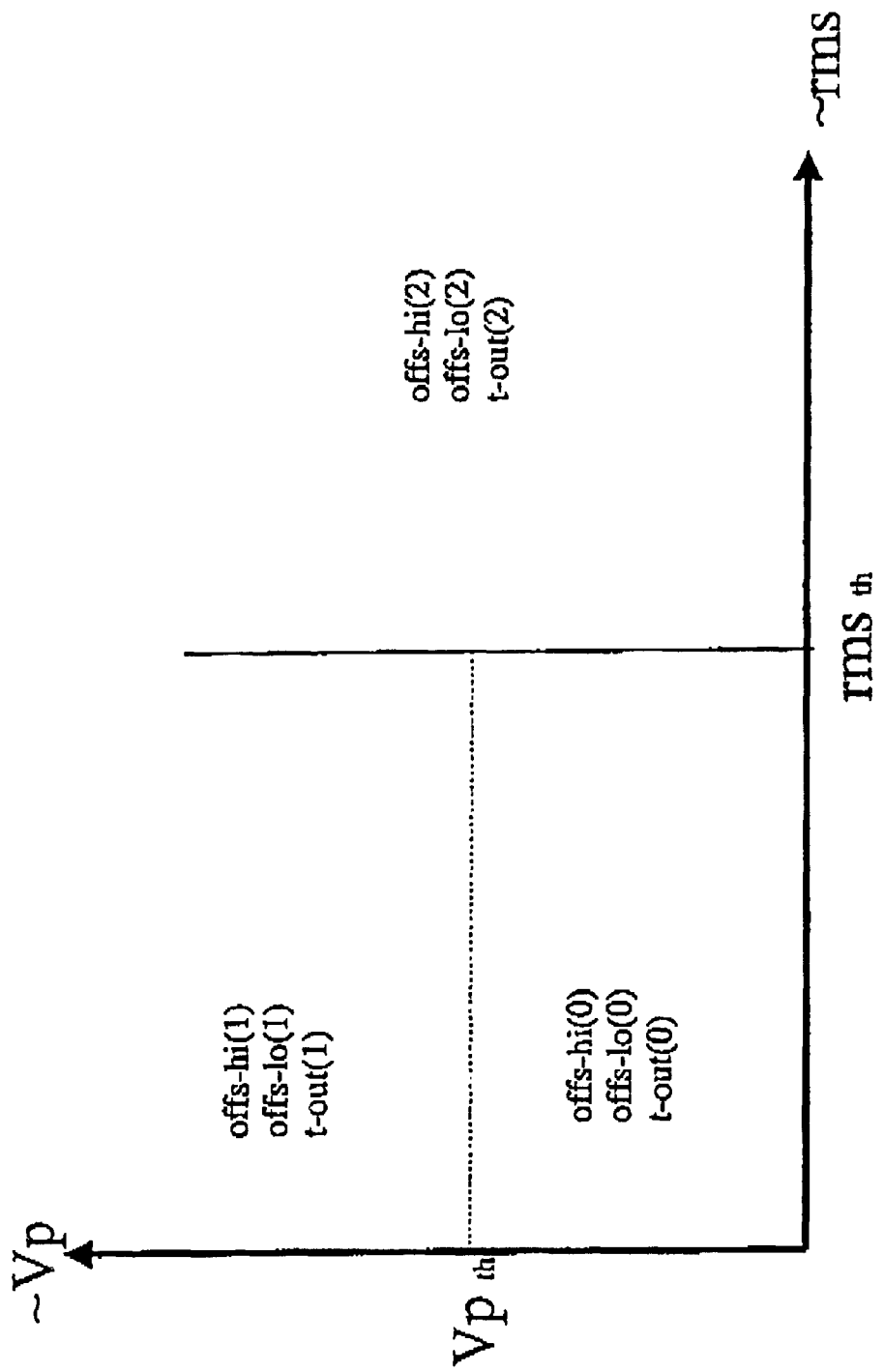
FIG. 6 shows a graph depicting the dependencies of the variable offsets and the blanking time on rms and Vp.

The passing of one of the thresholds th-hi and th-lo by the envelope following signal e causes a pulse triggering of the switch 25 whose lasting (blanking time t-out) depends on the actual rms and Vp values as shown in FIG. 6. According to FIG. 6, for rms values above a predetermined threshold rms th, there is generated a high offset offs-hi (2), a low offset offs-lo (2) and a blanking time t-out (2). For rms values below rmsth and Vp values being above a Vp threshold Vpth, there are generated a high offset offs-hi (1), a low offset offs-lo (1) and a blanking time t-out (1). For rms values below rms th and Vp values below Vp th, there are generated a high offset offs-hi (0), a low offset offs-lo (0) and a blanking time t-out (0).

In a modification of the embodiment of FIG. 5, the low pass filters 15h, 15l are located between the summing circuits 17h, 17l and the comparators 19h, 19l.

In a modified embodiment, the thresholds rmsth and Vpth are not fixed but are variable depending on the current rms value and/or the current Vp value.

The effect of this modeling is the following: for high values of the field-strength (rms high) values (2) will be chosen for offset thresholds and blanking time. For low values of the field-strength (rms low), values (1) or (0) will be chosen according to the peak level Vp of the AM-IF signal which is related to the modulation depth. This makes the AM noise blanker routine adapting on the quality of the AM signal received. The idea is to have short blanking time and high offsets for high values of the field-strength, and longer blanking time and lower offsets for low values of the field-strength.

There are the following relationships:

$$\text{offs-hi}(2) > \text{offs-hi}(1) > \text{offs-hi}(0) \quad (3)$$

$$\text{offs-lo}(2) > \text{offs-lo}(1) > \text{offs-lo}(0)$$

$$\text{t-out}(0) > \text{t-out}(1) > \text{t-out}(2) \quad (5)$$

In a modified embodiment, fixed thresholds rmsth and Vpth are replaced with variable thresholds depending on the actual rms value and/or the actual value of Vp.

A trigger pulse occurring upon the detection of a spike causes the switching of the AM audio path into the blanking and interpolating state. At the end of the blanking time and, in turn, the interpolation, the AM audio path is switched back to the non-blanking state.

Figure 7:
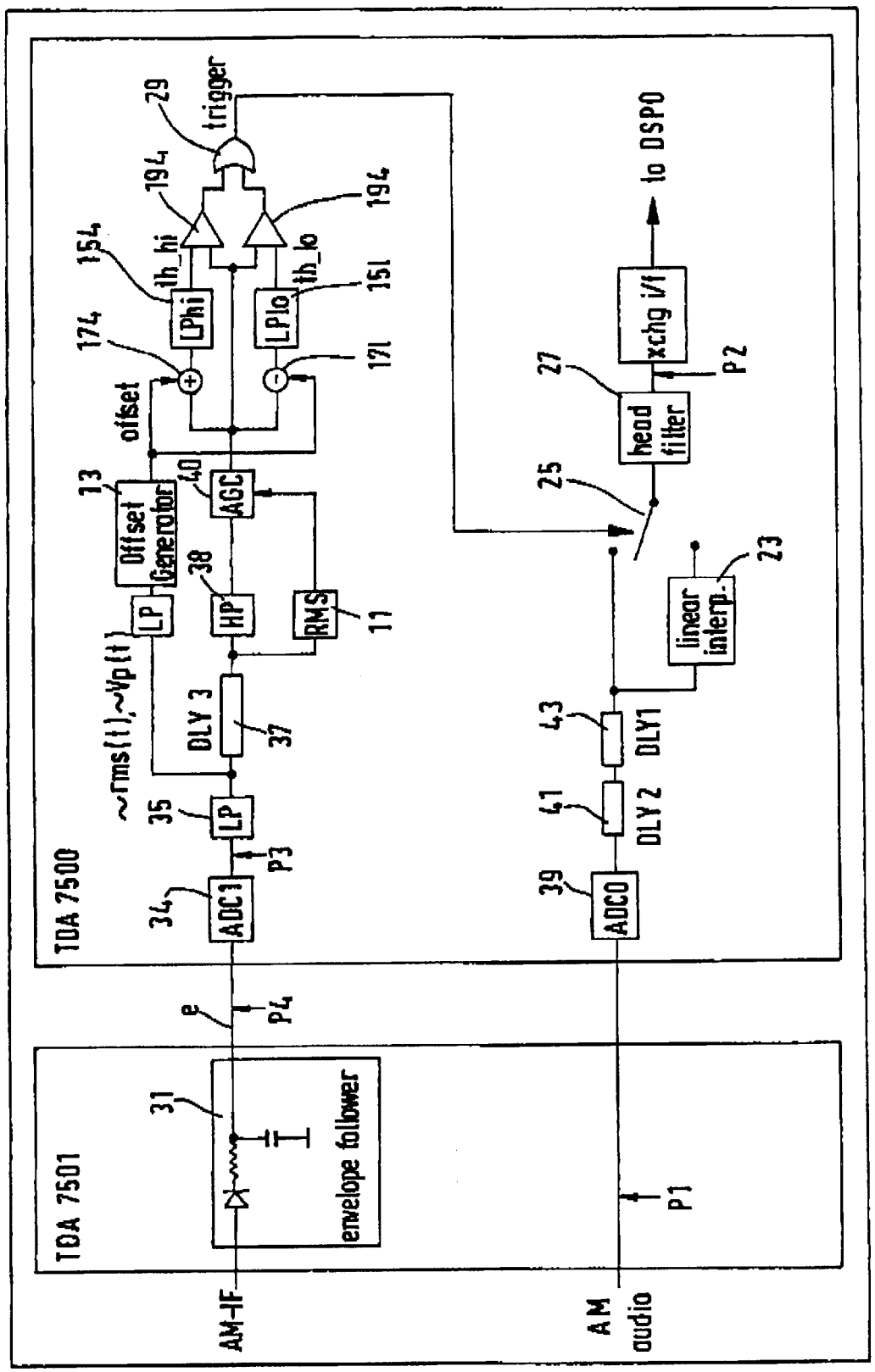
FIG. 7 shows a third embodiment of a spike detection and spike cancellation circuitry of the invention.

In a preferred embodiment shown in FIG. 7, the signal processing in the spike detection path and the pike cancellation path is made on a digital basis. This embodiment comprises all of the elements of FIG. 5 and additional elements required for the digital signal processing. Elements in FIG. 7 corresponding to elements in FIG. 5 have the same reference signs as in FIG. 5.

As shown in FIG. 7, the envelope follower 31 comprises a rectifier diode so that the positive envelope following signal is generated only. The envelope following signal e is supplied to a first analog/digital converter (ADC1) 34 digitizing the envelope following signal e into a sequence of pulses. The pulses from the ADC1 are filtered by a low-pass filter 35 in order to avoid any aliasing. The low-pass filtered signal is supplied to a digital delay line (DLY3) 37 having the function of elements 11 and 33 of FIG. 5. The samples contained in the delay line 37 are used to calculate two values which are proportional to the actual rms value rms (t) and the local peak level Vp (t) of the AM-IF signal. Calculation of rms and Vp values by means of a delay line is known to the expert and is not needed to be explained in more detail here.

These two values are used to modify the variable high offset value offs-hi and the variable low offset value offs-lo used to generate the variable high threshold th-hi and the variable low threshold th-lo moving around the envelope following signal e.

In the embodiment of FIG. 7, a single offset generator 13 is used and the output thereof is supplied to both summing circuits 17h and 17l. The low pass filters 15h and 15l are arranged between the respective summing circuit 17h, 17l and the respective comparator 19h, 19l, in modification to the embodiment of FIG. 5 where the low pass filters 15h and 15l are arranged upstream the summing circuit 17h and 17l, respectively.

Further, the AM-IF path or spike detection path of FIG. 7 comprises a high pass filter (HP) 38 connected to the output of the first delay line 37, and an automatic gain control (AGC) 40 controlling the signal from the high pass filter 38 in response to the actual rms value.

In the AM audio path or spike cancellation path, the samples coming from a second analog/digital converter (ADC0) 39 are delayed by means of a second delay line (DLY2) 41 and by a third delay line (DLY3) 43. The delay line 43 is designed to store a number of samples which correspond to the maximum blanking time to be expected. As already explained above in context with FIG. 5, the delay line 43 supplies to the linear interpolator 23 the last "good" sample before the blanking time and the first "good" sample after the blanking time so that the linear interpolator 23 can interpolate during the blanking time tb a sequence of samples which form a ramp between the last good sample before the blanking time and the first good sample after the blanking time.

When the trigger pulse or spike detection pulse is active, a linear interpolation between the last "good" sample before the trigger pulse and the first "good" sample after the blanking time is performed. Following the switch 25 is a steep low-pass filter 27 (called head filter) which removes all the spurious "clicks" introduced by the switching. The resulting pulse stream is passed to a digital signal processor DSPO which performs the audio processing.

Figure 8A:
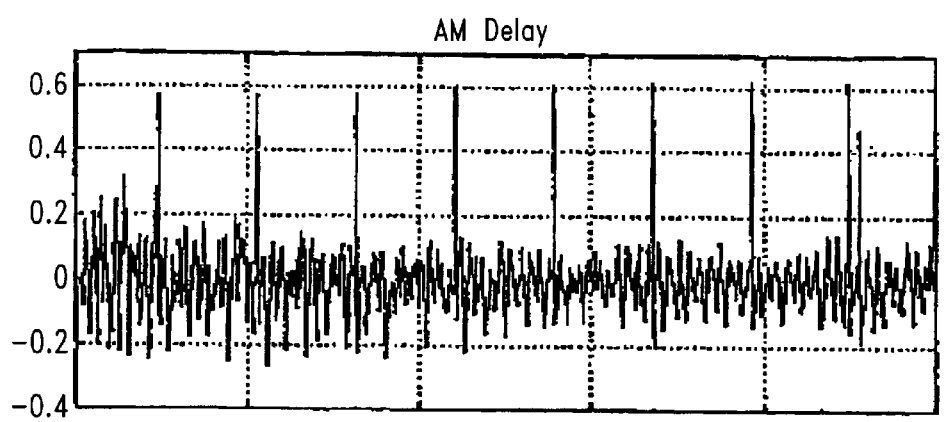
FIG. 8 shows (*a*) an AM signal with spikes, (*b*) trigger pulses fox starting blanking tunes, and (*c*) AM signals after removal of spikes and interpolation.
Figure 8B:
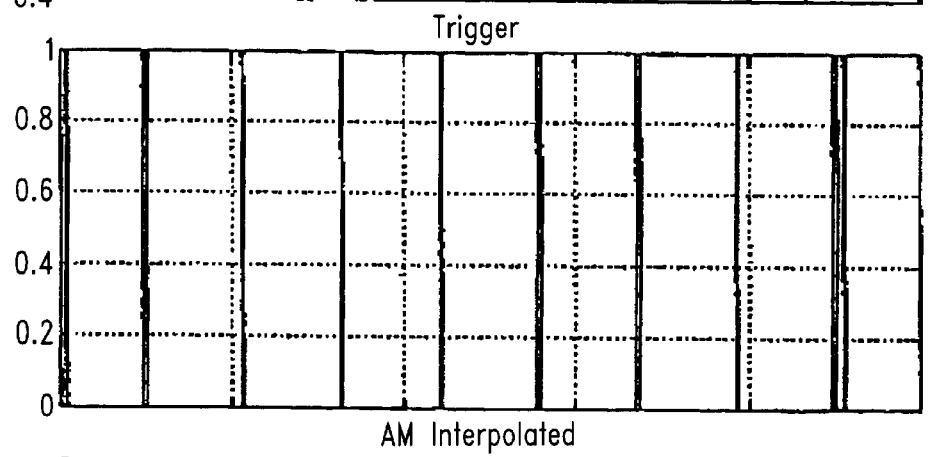
Figure 8C:
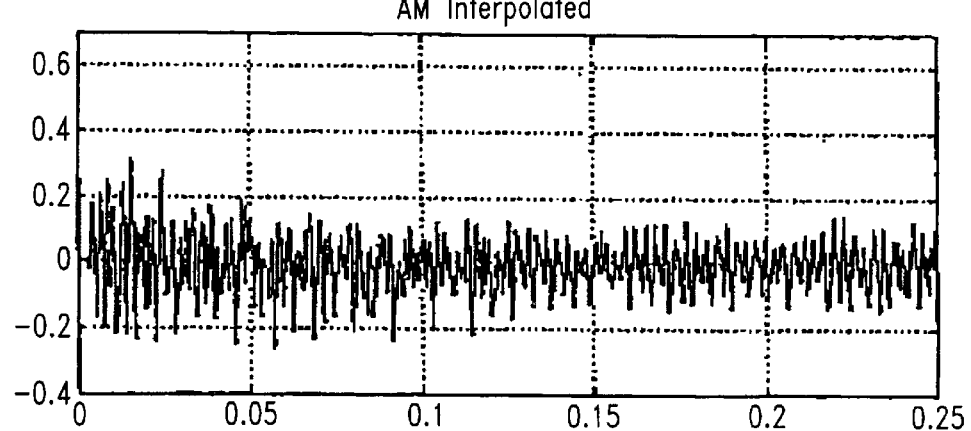
Figure 9A:
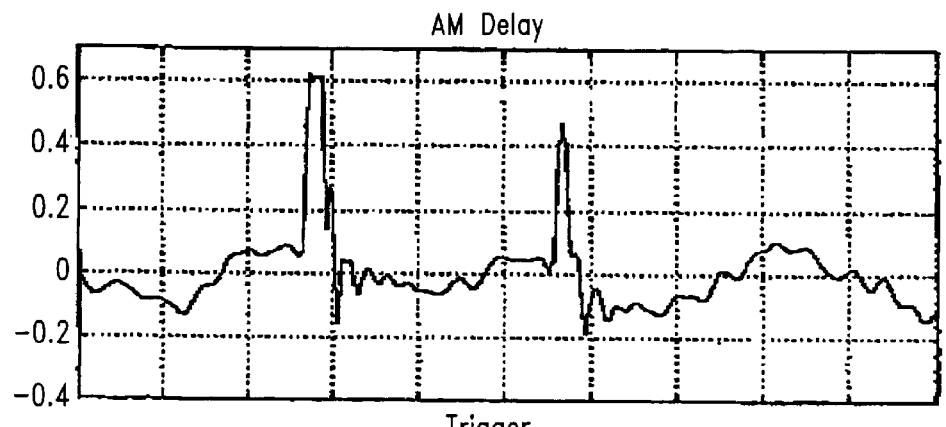
FIG. 9 shows the same signals as FIG. 8, however with higher resolution as to the time axis.
Figure 9B:
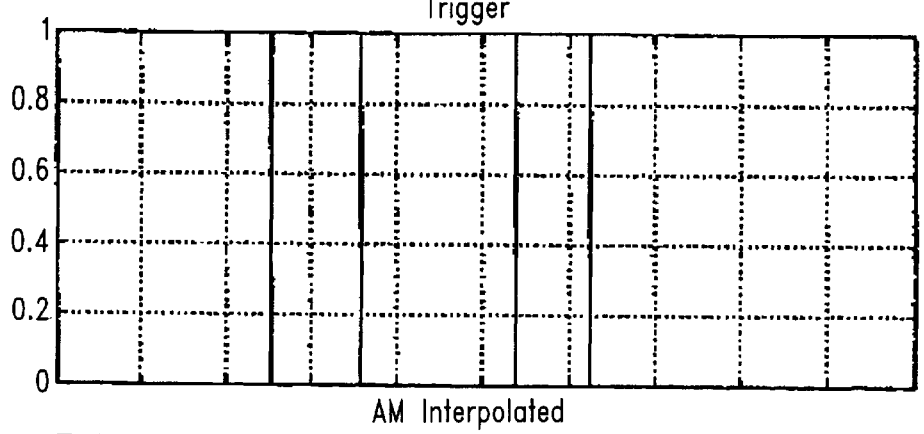
Figure 9C:
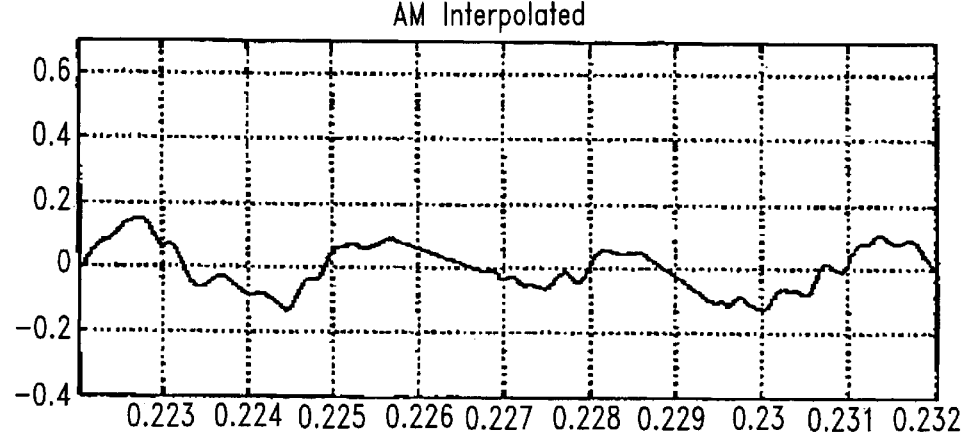

FIGS. 8 and 9 show signals occurring at different locations of the AM noise blanker circuit of FIG. 7, with FIG. 9 showing the signals with a higher resolution than FIG. 8. FIGS. 8(a) and 9(a) show the AM-IF signal having spikes. FIGS. 8(b) and 9(b) show trigger pulses at the output of OR gate 21. FIGS. 8(c) and 9(c) show the AM audio signal after spike cancellation and interpolation during the blanking times.

Figure 10:
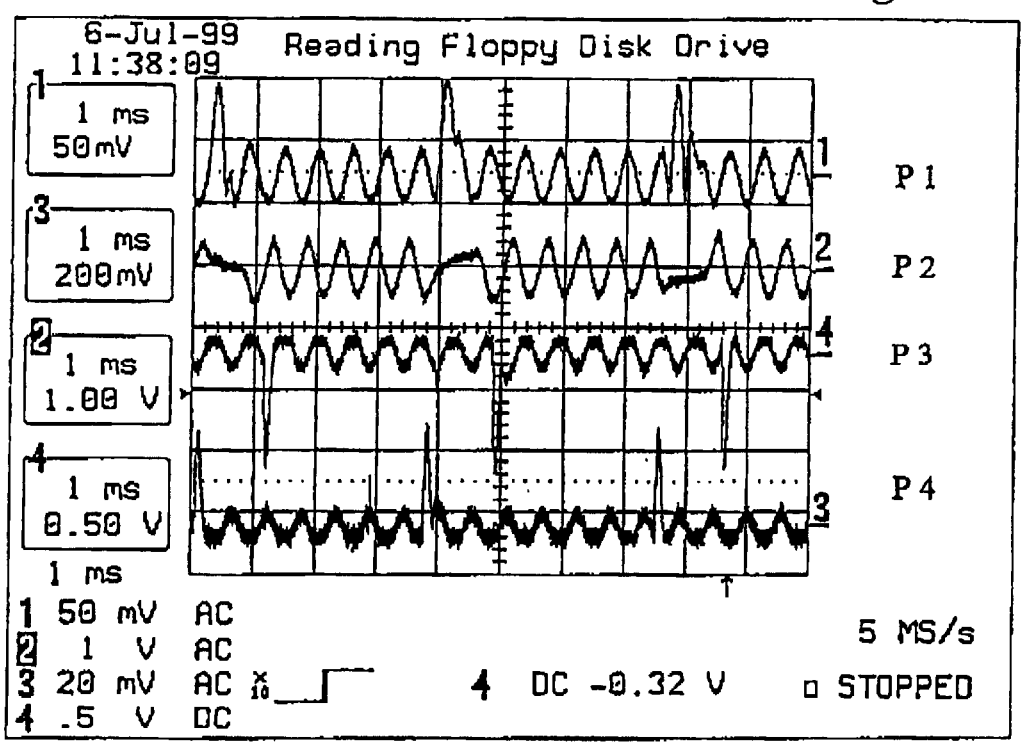
FIG. 10 shows signals measured at circuit points indicated in FIG. 7.

FIG. 10 shows signals at circuit points P1 to P4 indicated in FIG. 7, with the signal at P1 being the original audio AM signal, the signal at P2 being the blanked audio AM signal, the signal at P4 being the AM-IF envelope follower signal e, and the signal at P3 being the AM-IF envelope follower signal after the analog-to-digital conversion by means of ADC1.

The ADC1 converter 34, due to its own structure, makes causes a phase inversion and a delay (approximately 1 ms), therefore the original positive spikes of the signal at P4 are inverted at P3, and delayed of 1 ms.

Figure 11:
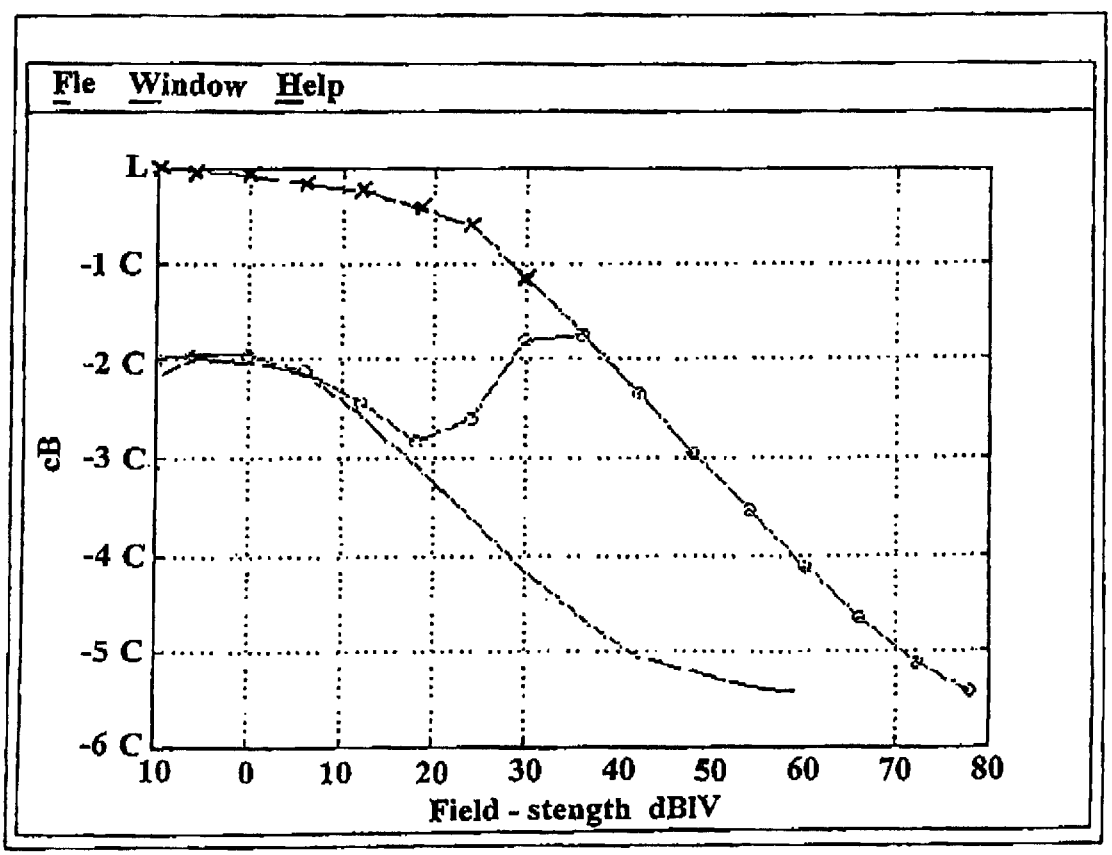
FIG. 11 shows the result of noise measurements.

FIG. 11 shows noise measurements. The x-line shows a noisy signal without noise blanking, the o-line shows a noisy signal with noise blanking, and the continuous line (the lowest line) shows a clean signal, i.e., a signal without noise. It can be seen from FIG. 11 that an implementation of the present invention such as shown in FIG. 7 results in a signal which is almost as free of noise as the clean signal at a lower range of the field-strength which is the range where AM signals are particularly sensitive to noise and noise spikes.

In an implementation of the embodiment of FIG. 7, the low pass filter 35 has a cut-off frequency of 20 KHz, the low-pass filter part of the envelope follower 31 has a cut-off frequency of 28 KHz, and the analog/digital converters 33 and 39 have a sampling frequency of 48.5 KHz. The delay line 41 is for compensating any difference in the behavior of the analog/digital converters 33 and 39.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. Method for removing noise spikes from an electrical input signal having an AC component, comprising the following steps:
   determining an actual rms value of the input signal;
   low pass filtering the input signal;
   producing a variable offset, said variable offset being a function of the actual rms value;
   forming a variable threshold by superimposing the variable offset to the low pass filtered signal;
   comparing the input signal to the variable threshold;
   creating a spike detection signal when the input signal passes the variable threshold; and
   blanking a portion of the input signal for a blanking time during an occurrence of the spike detection signal.

2. The method of claim 1 wherein the blanking time is made dependent on the actual rms value.

3. The method of claim 1, comprising the further steps of:
   storing a portion of the input signal occurring during a predetermined time period;
   interpolating a course of the input signal during the blanking time from values of the input signal occurring before a beginning and after an end of the blanking time; and
   replacing the blanked portion of the input signal with the interpolated course.

4. The method of claim 1 wherein the noise spikes are positive spikes from the input signal, wherein the variable threshold is formed by adding to the low passed input signal the variable offset, which is positive, and the spike detection signal is created when the input signal is above the variable threshold.

5. The method of claim 1 wherein the noise spikes are negative spikes from the input signal, wherein the variable threshold is formed by subtracting from the low passed input signal the variable offset, which is negative, and the spike detection signal is created when the input signal is below the variable threshold.

6. The method of claim 1 wherein the noise spikes include positive and negative spikes from the input signal, the variable offset includes a positive variable offset and a negative variable offset, and the variable threshold includes a high variable threshold formed by adding to the low passed input signal the positive variable offset and a low variable threshold formed by subtracting from the low passed input signal the negative variable offset, and the spike detection signal is created when the input signal is above the high variable threshold or below the low variable threshold.

7. The method of claim 1, comprising the steps of:
   digitizing the input signal into a sequence of pulses;
   dividing the sequence of pulses into blocks each having a predetermined number of pulses; and
   wherein the determining step includes calculating an actual rms value of each block.

8. The method of claim 7, comprising the further steps of:
   transmitting the pulses through a digital delay line having taps for tapping pulses traveling through the delay line;
   upon occurrence of a spike detection signal, tapping from the delay line the pulses occurring before a beginning and after an end of the blanking time;
   interpolating the course of the input signal during the blanking time from the tapped pulses; and
   during the blanking time, replacing the pulses resulting from digitizing the input signal with pulses obtained from the interpolation.

9. The method of claim 1 wherein the input signal includes a demodulated signal obtained by amplitude demodulating an amplitude modulated signal, comprising the steps of:
   generating an envelope signal from the amplitude modulated signal;
   wherein the determining step includes calculating from the envelope signal an actual rms value and a local peak value of the envelope signal;
   wherein the low pass filtering step includes low pass filtering the envelope signal;
   wherein the producing step includes producing said variable offset as a function of the actual rms value and the local peak value;
   wherein the forming step includes forming the variable threshold by superimposing the variable offset to the low pass filtered envelope signal;
   wherein the comparing step includes comparing the envelope signal to the variable threshold;
   wherein the creating step includes creating a spike detection signal when the envelope signal passes the variable threshold; and
   wherein the blanking step includes blanking the demodulated signal during the occurrence of the spike detection signal.

10. The method of claim 9 wherein the blanking time is made dependent on the local peak value.

11. The method of claim 9, comprising the steps of:
    storing a portion of the demodulated signal occurring during a predetermined time period;
    interpolating a course of the demodulated signal during the blanking time from the values of the input signal occurring before a beginning and after an end of the blanking time; and
    during the blanking time, replacing the demodulated signal with the interpolated course.

12. Apparatus for removing noise spikes from an electrical input signal having an AC component, comprising:
   means for determining an actual rms value of the input signal;
   a low pass filter that low pass filters the input signal;
   an offset generator for producing a variable offset as a function of the actual rms value;
   superimposition means for forming a variable threshold by superimposing the variable offset to the low pass filtered signal;
   comparator means for comparing the input signal to the variable threshold and for creating a spike detection signal when the input signal passes the variable threshold; and
   blanking means for blanking the input signal for a blanking time during an occurrence of the spike detection signal.

13. The apparatus of claim 12, designed for controlling the blanking time to be dependent on the actual rms value.

14. The apparatus of claim 12, comprising:
   storing means for storing a portion of the input signal occurring during a predetermined time period;
   interpolation means for interpolating a course of the input signal during the blanking time from values of the input signal occurring before a beginning and after an end of the blanking time; and
   replacement means for replacing the input signal with the interpolated course.

15. The apparatus of claim 12 wherein the noise spikes include positive spikes from the input signal, comprising adding means designed for forming the variable threshold by adding to the input signal the variable offset, which is positive.

16. The apparatus of claim 12 wherein the noise spikes include negative spikes from the input signal, comprising subtracting means designed for forming the variable threshold by subtracting from the input signal the variable offset, which is negative.

17. The apparatus of claim 12 wherein the noise spikes include positive and negative spikes from the input signal and the variable offset includes a positive variable offset and a negative variable offset, comprising:
   adding means designed for forming the variable threshold as a high variable threshold by adding to the input signal the positive variable offset; and
   subtracting means designed for forming the variable threshold as a low variable threshold by subtracting from the input signal the negative variable offset;
   wherein the comparator means are designed for creating the spike detection signal when the input signal is above the high variable threshold or below the low variable threshold.

18. The apparatus of claim 12, comprising:
   digitizing means designed for digitizing the input signal into a sequence of pulses; and
   dividing means designed for dividing the sequence of pulses into blocks each having a predetermined number of pulses; and
   wherein the determining means includes rms calculating means designed for calculating the actual rms value of each block.

19. The apparatus of claim 18, comprising:
   digital delay line means delaying the pulses and having taps for tapping pulses traveling through the delay line means;
   pulse selection means selecting, upon occurrence of the spike detection signal, tapped pulses occurring before a beginning and after an end of the blanking time; and
   interpolation means interpolating the course of the input signal during the blanking time from the selected pulses and wherein the blanking means includes means for replacing the pulses of the input signal occurring during the blanking time with pulses obtained from the interpolation means.

20. The apparatus of claim 12 wherein the input signal includes a demodulated signal obtained by amplitude demodulating an amplitude modulated signal, comprising:
   envelope signal generating means designed for generating an envelope signal from the amplitude modulated signal;
   wherein the determining means include calculating means designed for calculating from the envelope signal the actual rms value and a local peak value of the envelope signal;
   wherein the low pass filter means low pass filters the envelope signal;
   wherein the offset generator generates said variable offset as a function of the actual rms value and the local peak value;
   wherein the superimposition means generate the variable threshold by superimposing the variable offset to the low pass filtered envelope signal;
   wherein the comparator means compares the envelope signal to the variable threshold and create the spike detection signal when the envelope signal passes the variable threshold; and
   wherein the blanking means blank the demodulated signal during the occurrence of the spike detection signal.

21. The apparatus of claim 20, designed for controlling the blanking time to be dependent on the local peak value.

22. The apparatus of claim 20, comprising;
   storing means for storing a portion of the demodulated signal occurring during a predetermined time period; and
   interpolating means for interpolating a course of the demodulated signal during the blanking time from the values of the input signal occurring before a beginning and after an end of the blanking time, and wherein the blanking means include means for replacing the input demodulated signal with the interpolated course during the blanking time.

23. A system comprising:
   a spike detection path including:
      an RMS calculator including an input that receives an input signal, an actual RMS output that outputs an actual RMS value of the input signal, and a first signal pass output that outputs the input signal;
      a first low pass filter coupled to the first signal pass output and having a low pass output;
      an offset generator coupled to the actual RMS output and having a variable offset output;
      a summing circuit coupled to the variable offset output and the low pass output, the summing circuit having a variable threshold output;
      a comparator having an signal input coupled to the first signal pass output and a threshold input coupled to the variable threshold output, the comparator having a spike detection output; and
   a spike cancellation path including;
      a delay line having a signal input configured to receive the input signal, delay output tabs, and a second signal pass output configured to output the input signal;

a switch having first and second inputs and an output, the first input being coupled to the second signal pass output; and an interpolator having inputs coupled to the delay output tabs and coupled to the actual RMS output and the spike detection output, the interpolator having an output coupled to the second input of the switch.

24. The system of claim 23 wherein the delay line is configured to store a course of values of the input signal during a predetermined blanking time; wherein the interpolator is configured to interpolate the course of the input signal and wherein the interpolator and switch are configured to replace the input signal with the interpolated course.

25. The system of claim 23 comprising a second summing circuit coupled to the comparator.

26. The system of claim 23 comprising a subtractor coupled to the comparator.

27. The system of claim 23 comprising a second summing circuit and a subtractor both coupled to the comparator.

28. The system of claim 23 comprising:

an analog/digital converter configured to digitize the input signal into a sequence of pulses; and a divider configured to divide the sequence of pulses into blocks each having a predetermined number of pulses; and the RMS calculator is configured to calculate the actual RMS value of each block.

* * * * *